United States Patent [19]

Yoshimura

[11] Patent Number: 5,802,328
[45] Date of Patent: Sep. 1, 1998

[54] APPARATUS FOR DETECTING CORRECT INSERTION OF A PC CARD IN AN INFORMATION PROCESSING SYSTEM

[75] Inventor: Yoshimasa Yoshimura, Tokyo, Japan

[73] Assignee: Mitsubishi Denki Kabushiki Kaisha, Tokyo, Japan

[21] Appl. No.: 759,000

[22] Filed: Dec. 2, 1996

[30] Foreign Application Priority Data

May 30, 1996 [JP] Japan ................. 8-136597

[51] Int. Cl.$^6$ ................ G06F 13/00; H01R 9/09; H01R 13/642; H05K 7/10
[52] U.S. Cl. ................ 395/282; 395/283; 439/59
[58] Field of Search ............... 395/282, 283, 395/309; 439/59, 62, 377; 307/38, 147; 361/683

[56] References Cited

U.S. PATENT DOCUMENTS

| | | | |
|---|---|---|---|
| 4,715,820 | 12/1987 | Andrews, Jr. et al. | 439/59 |
| 5,404,268 | 4/1995 | O'Connor | 361/683 |
| 5,555,510 | 9/1996 | Verseput et al. | 395/282 |
| 5,568,610 | 10/1996 | Brown | 395/185.01 |
| 5,581,127 | 12/1996 | Shinohara | 257/679 |
| 5,655,092 | 8/1997 | Ojala | 395/309 |

FOREIGN PATENT DOCUMENTS

| | | |
|---|---|---|
| 63-039396 | 2/1988 | Japan . |
| 3-171277 | 7/1991 | Japan . |
| 4-323098 | 11/1992 | Japan . |

*Primary Examiner*—Gopal C. Ray

[57] ABSTRACT

The PC card system device including a PC card in conformity with the PC card standard and an information processing device which the PC card is to be connected, comprises a card connector provided in the PC card, a device connector, provided in the information processing device, a connection state detector for detecting the connection state of the PC card according to the signal level of at least one contact of the device connector, and an interface controller for controlling the signal transfer from the device connector according to the determination of the connection state detector. The interface controller prohibits any signal transfer from the device connector if the connection state detector determines that the PC card is incorrectly connected to the information processing device.

14 Claims, 8 Drawing Sheets

APPARATUS FOR DETECTING CORRECT INSERTION OF A PC CARD IN AN INFORMATION PROCESSING SYSTEM

BACKGROUND OF THE INVENTION

1. Field of the Invention

The present invention relates generally to a PC card system in which a PC card, in conformity with the PCMCIA/JEIDA PC card standard, is used in conjunction with an information processing device, such as a personal computer, and, more particularly, to an interface of the PC card system which connects the PC card to the information processing device.

2. Description of the Prior Art

Figure 9:
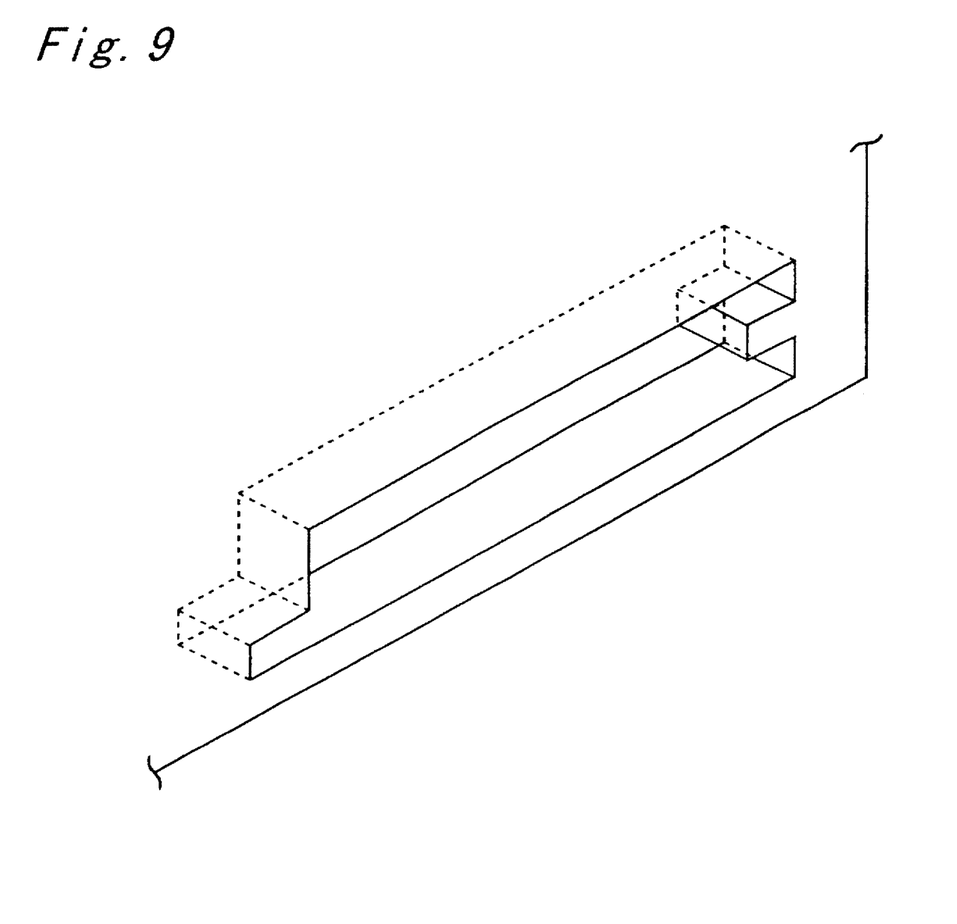
FIG. 9 is a perspective view of the shape of the PC card slot for a PC card in conformity with the PCMCIA/JEIDA PC card standard.

FIG. 9 is a schematic perspective view of a PC card slot provided for inserting a PC card to connect the PC card to an information processing device. According to the PCMCIA/JEIDA PC card standard, the PC card is defined to have a predetermined key structure so as to fit into the PC card slot in order to prevent the PC card from inserting incorrectly, i.e. in a reversed relation between upper and lower surfaces thereof.

However, since the PC card itself is a thin sheet material made of a synthetic resin and, therefore, deformable, it is difficult to completely prevent incorrect insertion of the PC card by the key structure mentioned above. In fact, the PC card can be inserted incorrectly due to deformation of the key structured portions when inserted with a large force. Since the layout or arrangement of female contacts of the PC card in conformity with the above standard is symmetric with respect to both horizontal and vertical center lines of the connector of the PC card, all female contacts of the PC card engage with male contacts (pins) formed in the PC card slot even if the PC card is inserted incorrectly. Namely, the PC card is brought into a bi-directionally communicable state with the information processing device even when inserted incorrectly. In such a case, respective application programs are executed with wrong data and, in the worst case, the PC card is damaged electrically. Thus, the structural design is limited in its ability to prevent the incorrect insertion when excessive force is used.

SUMMARY OF THE INVENTION

An essential object of the present invention, therefore, is to solve the aforementioned problem and to provide a PC card system device comprising means for preventing electrical damages to the PC card even if the card is inserted incorrectly into an information processing device, the means not dependent on a structural design which has a limited mechanical strength.

The present invention relates to a PC card system device comprising a PC card in conformity with the PCMCIA/JEIDA PC card standard and an information processing device to which the PC card is connected. The present invention provides a PC card system device comprising (a) a card connector means, provided in the PC card, for connecting the PC card to the information processing device; (b) a device connector means, provided in the information processing device, in conformity with the PC card standard, for connecting the information processing device to the PC card; (c) a connection state detecting means for detecting the connection state of the PC card according to the signal level of at least one terminal of the device connector means; and (d) an interface control means for controlling the signal transfer from the device connector means according to a connection state determined or detected by the connection state detecting means. The interface control means forbids any signal transfer from the device connector means if the connection state detecting means determines that the PC card is incorrectly connected to the information processing device.

More specifically, either the seventeenth terminal or fifty-first terminal of the above device connector, referred to the Vcc1 terminal, is connected to the power supply of the information processing device, and the other terminal, referred to as the Vcc2, is connected to the power supply of the information processing device through a first switch means and to a pull-down resistor. For example, the connection state detecting means determines that the PC card is incorrectly connected when the Vcc2 terminal of the device connector means is "L", and that the PC card is properly connected when the Vcc2 terminal of the device connector means is "H". The interface control means turns on the first switch means only when the connection state detecting means determines that the PC card is properly connected.

The above PC card system device may further comprise a second switch means connected between the Vcc2 terminal of the device connector means and the pull-down resistor. The interface control means turns off the second switch means only when the connection state detecting means determines that the PC card is properly connected.

The above PC card system device may further comprise (a) a connection detecting means for determining whether or not the PC card is connected to the information processing device according to the signal level of at least one terminal of the device connector means and (b) a third switch means, placed between the power supply of the information processing device and the terminals of the device connection means for providing power to the PC card, for controlling the supply of power to the PC card. The connection detecting means may turn on the third switch means only when the connection detecting means determines that the PC card is connected to the information processing device, allowing the power supply voltage to be applied to the terminals of the device connector means.

More specifically, the third switch means controls the supply of power from the information processing device to the terminal Vcc1 of the device connector means and to the first switch means. The connection detecting means turns on the third switch means to allow the power supply voltage to be applied to the terminal Vcc1 and to the first switch means only when the connection detecting means determines that the PC card is connected to the information processing device.

For example, the connection detecting means determines whether or not the PC card is connected to the information processing device according to the signal levels of the second, thirty-third, thirty-sixth, and sixty-seventh terminals of the device connector means. Further, in a case where the second, thirty-third, thirty-sixth, and sixty-seventh terminals of the device connector means are connected to pull-up resistors, the connection detecting means determines that the PC card is not connected to the information processing device when the second, thirty-third, thirty-sixth, and sixty-seventh terminals are all at an "H" level and that the PC card is connected to the information processing device when both the second and the thirty-third terminals are at an "L" level or when both the thirty-sixth and the sixty-seventh terminals are at an "L" level.

The PC card system device may comprise a fourth switch means, instead of the third switch means, placed between the power supply of the information processing device and the terminals of the device connection means, for providing power to the PC card, in order to control the supply of power to the PC card. In this case the interface control means turns on the fourth switch means allowing the power supply voltage to be applied to the terminals of the device connector means only when the connection state detecting means determines that the PC card is properly connected to the information processing device.

More specifically, the fourth switch means controls the supply of power from the information processing device to the first switch means and to the terminal Vcc1 of the device connector means. The interface control means turns on the fourth switch means allowing the power supply voltage to be applied to the first switch means and to the terminal Vcc1 of the device connector means only when the connection state detecting means determines that the PC card is properly connected to the information processing device.

For example, the above connection state detecting means determines whether or not the PC card is connected to the information processing device according to the signal levels of the second, thirty-third, thirty-sixth, and sixty-seventh terminals of the device connector means. In a case where the second, thirty-third, thirty-sixth, and sixty-seventh terminals of the device connector means are connected to pull-up resistors, the connection state detecting means determines that the PC card is not connected to the information processing device when the second, thirty-third, thirty-sixth, and sixty-seventh terminals are all at an "H" level. The connection state detecting means also determines that the PC card is properly connected to the information processing device when both the thirty-sixth and the sixty-seventh terminals are at an "L" level and that the PC card is incorrectly connected to the information processing device when both the second and the thirty-third terminals are at an "L" level.

BRIEF DESCRIPTION OF THE DRAWINGS

These and other objects and features of the present invention will become clear from the following description taken in conjunction with the preferred embodiment thereof with reference to the accompanying drawings throughout which like parts are designated by like reference numerals, and in which.

DETAILED DESCRIPTION OF THE PREFERRED EMBODIMENT

The embodiment of the present invention will be described in detail with reference to the accompanying drawings.

Embodiment 1

Figure 1A:
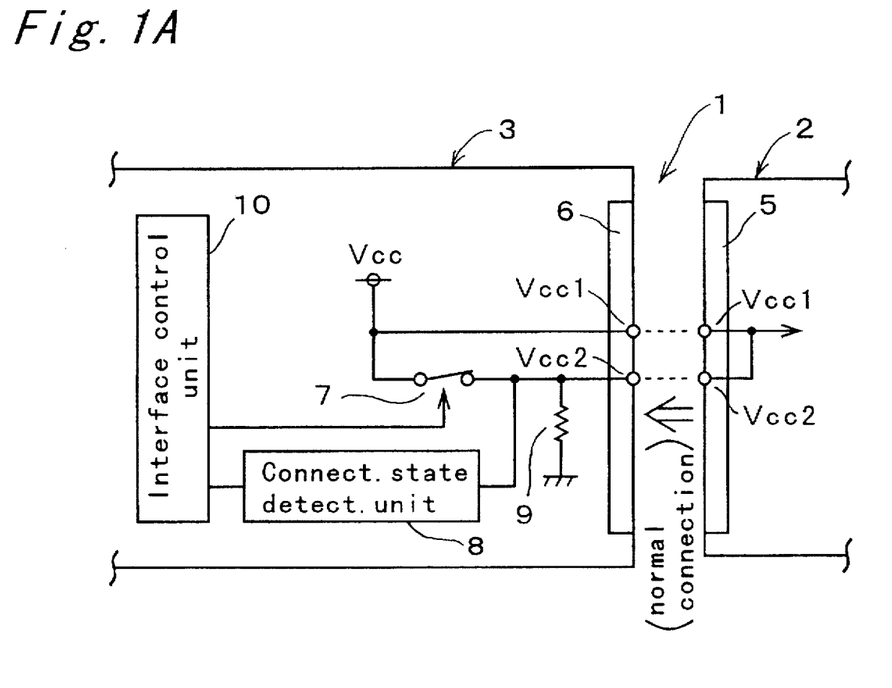
FIGS. 1A and 1B are schematic block diagrams of a PC card system device of Embodiment 1 of the present invention for showing correct and incorrect connection states of a PC card.

FIG. 1 is a schematic block diagram of a PC card system device of Embodiment 1 of the present invention. The PC card system 1 shown in FIG. 1 comprises a PC card 2, in conformity with the PCMCIA/JEIDA PC card standard, and an information processing device 3 including an interface for connecting the PC card to the information processing device. The shape of the PC card slot provided to the information processing device is assumed to be the same as the one as shown in FIG. 9 and hence a further description of it will not be given.

The aforementioned interface portion comprises a card connector 5 provided to the PC card 2, a device connector 6, in conformity with the PC card standard, provided to the information processing device, a switch 7 controlled with control signals, a connection state detecting unit 8 for detecting the state of the connection of the PC card 2 to the information processing device 3, a pull-down resistor 9, and an interface control unit 10 for controlling the switch 7 according to the connection state detected by the connection state detecting unit 8 and for controlling the transfer of signals from the device connector 6. In FIG. 1, the card connector 5 forms a card connector means for connecting the card to the device; the device connector 6, a device connector means for connecting the device to the card; the switch 7, a first switch means; the connection state detecting unit 8, a connection state detection means; and the interface control unit 10, an interface control means.

The card connector 5 has two rows of 34 female contacts, 68 female contacts total. The device connector 6 also has two rows of 34 pins as male contacts, 68 pins total. The seventeenth female contact of the card connector 5 and corresponding pin of the device connector 6 are referred to as Vcc1. The fifty-first female contact of the card connector 5 and corresponding pin of the device connector 6 are referred to as Vcc2. Likewise, the eighteenth female contact of the card connector 5 and corresponding pin of the device connector 6 are referred to as Vpp1. The fifty-second female contact of the card connector 5 and corresponding pin of the device connector 6 are referred to as Vpp2.

The contacts Vcc1 and Vcc2 of the card connector 5 and the device connector 6 are provided for supplying power to the PC card 2. The contact Vcc1 of the device connector 6 is connected to the DC power supply of voltage Vcc (hereinafter simply referred to as the DC power supply Vcc) of the information processing device. The contact Vcc2 of the device connector 6 is connected to the DC power supply Vcc through the switch 7. The contact Vcc2 of the device connector 6 is also connected to the input terminal of the connection state detecting unit 8, the output terminal of which, in turn, is connected to the interface control unit 10. Further, the resistor 9 is connected between the contact Vcc2 of the device connector 6 and the ground. The contacts Vcc1 and Vcc2 of the card connector 5 are connected together inside the card.

The interface control unit 10, in its initial state, prohibits any signal transfer from the device connector 6 and turns off the switch 7. When the PC card 2 is properly inserted into the card slot of the information processing device, the contact Vcc1 of the device connector 6 is connected to the contact Vcc1 of the card connector 5; and the contact Vcc2 of the device connector 6 is connected to the contact Vcc2 of the card connector 5.

Then the power supply voltage is provided to the Vcc2 contact of the device connector 6 through the Vcc1 and Vcc2 contacts of the card connector 5 causing the level of the input terminal of the connection state detecting unit 8 to be "H". The connection state detecting unit 8 determines that the PC card 2 has been properly connected to the information processing device 3 and sends a signal of this determination to the interface control unit 10. Receiving this signal from the connection state detecting unit 8, indicating that the PC card 2 has been properly connected to the information processing device 3, the interface control unit 10 turns on the switch 7 and removes the prohibition of the signal transfer from the device connector 6. Thus, the PC card 2 is provided with power through both the Vcc1 and Vcc2 contacts of the card connector 5.

Figure 1B:
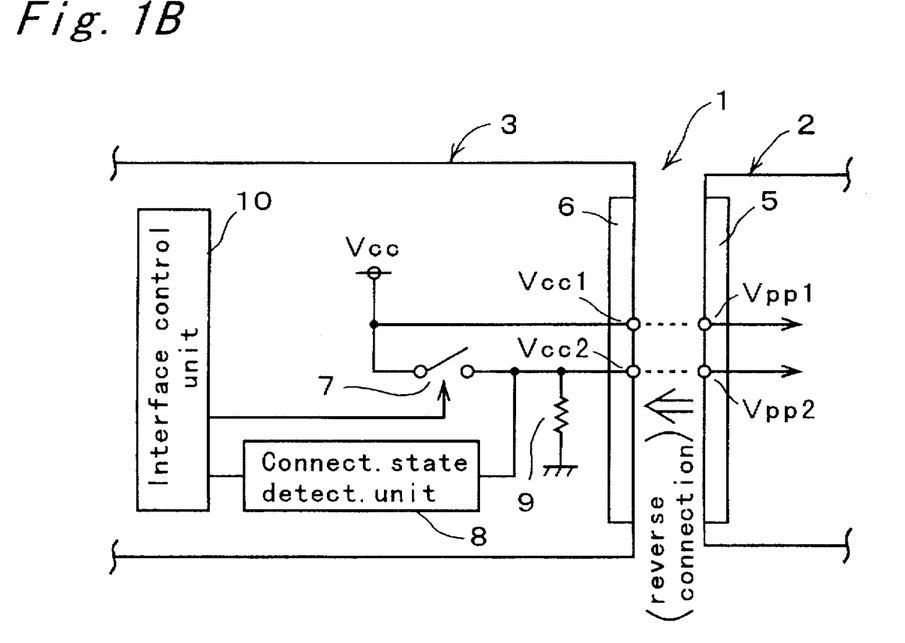

When the PC card is incorrectly forced into the card slot of the information processing device, the Vcc2 contact of the device connector 6 joins the Vpp1 of the card connector 5 and the Vcc2 contact of the device connector 6 joins the Vpp2 of the card connector 5 as shown in FIG. 1 (b). The Vpp1 and Vpp2 contacts of the card connector 5 are the input terminals for the program power supply from the information processing device and are not connected with each other inside the PC card 2.

Since the Vcc2 of the device connector is grounded through the resistor 9, the input terminal of the connection state detecting unit 8 is "L". The connection state detecting unit 8 determines that the PC card 2 has been inserted incorrectly into the information processing device 3 and sends a signal of this determination to the interface control unit 10. Receiving this signal, from the connection state detecting unit 8 that the PC card 2 has been incorrectly inserted into the information processing device 3, the interface control unit 10 turns off the switch 7 and prohibits any signal transfer from the device connector 6. That is, the interface control unit 10 remains in the same state as the initial state and prevents electrical damage to the PC card 2. All other pins and terminals of the connectors 5 and 6 except for those mentioned above are not shown in FIG. 1 to avoid confusion.

Figure 2:
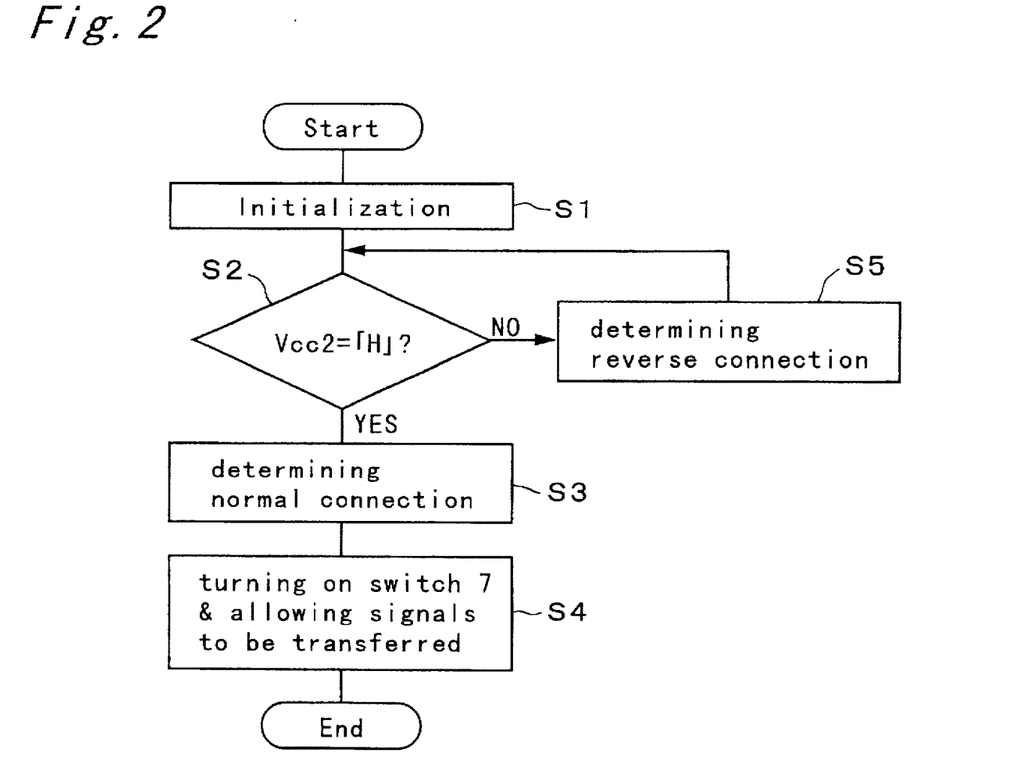
FIG. 2 is a flow chart showing the operation of the PC card system device shown in FIG. 1A.

FIG. 2 is a flow chart showing operation of the PC card system 1 shown in FIG. 1.

In the step S1 the interface control unit 10 sets the initial state in which it turns off the switch 7 and prohibits any signal transfer from the device connector 6. In the step S2 the connection state detecting unit 8 determines whether or not the level of its input terminal or the level of the Vcc2 contact of the device connector 6 is "H". That is, the connection state detecting unit 8 determines whether or not the card connector 5 is properly connected to the device connector 6. If the level is "H" (Yes), the operation moves to the step S3.

In the step S3 the connection state detecting unit 8 determines that the card connector 5 is properly connected to the device connector 6 and advances to step S4 after sending a signal indicating this determination to the interface control unit 10. In the step S4, after receiving the signal indicating that the PC card 2 is properly connected to the information processing device, the interface control unit 10 allows signals to be transferred from the output contacts of the device connector 6 and turns on the switch 7. Then the operation ends. If the level of the signal is "L" (No) in the step S2, the operation moves to the step S5, where the connection state detecting unit 8 determines that the card connector 5 is incorrectly connected to the device connector 6, and the operation moves back to step S2 after sending a signal indicating this determination to the interface control unit 10.

Thus, the PC card system device 1 of the present embodiment is able to determine whether or not the PC card 2 is incorrectly connected to the information processing device 3. The PC card system device 1 also prohibits any signal transfer from the device connector 6 unless the PC card 2 is properly connected to the information processing device 3. Therefore, this embodiment prevents, in a simple and inexpensive way, electrical damage to the PC card 2 due to the incorrect connection.

Embodiment 2

In Embodiment 1 the Vcc2 contact of the device connector 6 is grounded through the pull-down resistor 9. Therefore, when the PC card 2 is properly connected to the information processing device, the DC voltage is always applied to the resistor 9 and hence the resistor 9 always consumes current. Embodiment 2 of the present invention, therefore, prevents the current from flowing through the resistor 9 even when the PC card 2 is properly connected to the information processing device.

Figure 3:
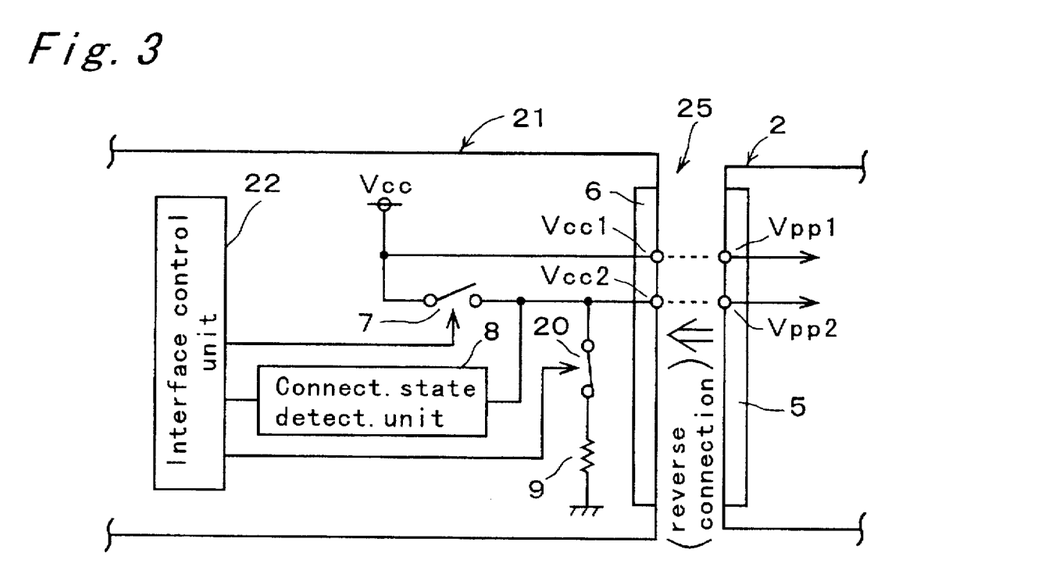
FIG. 3 is a schematic block diagram of the PC card system device of Embodiment 2 of the present invention.

FIG. 3 is the schematic block diagram of a PC card system device of Embodiment 2 of the present invention. The drawing shows the PC card 2 incorrectly connected to an information processing device. The like reference numerals in FIGS. 1 and 3 indicate identical or functionally similar elements. Thus explanation of those elements will not be repeated and only the differences with FIG. 1 will be described below. The difference between FIG. 3 and FIG. 1 is that a PC card system device 25 shown in FIG. 3 comprises an information processing device 21 which includes an additional switch 20 which is controlled with control signals produced by an interface control unit 22.

Referring to FIG. 3, the resistor 9 is connected, on one end, to the Vcc2 contact of the device connector 6 through the switch 20 and is grounded on the other end. The interface control unit 22 is connected to the output terminal of the connection state detecting unit 8. Depending upon the determinations of the connection state detecting unit 8, the interface control unit 22 switches the switches 7 and 20 and controls the signal transfer from the device connector 6. The switch 20 forms a second switch means and the interface control unit 22 forms an interface control means. Again, all other contacts of the connectors 5 and 6 except for those mentioned above, are not shown in FIG. 3 in order to avoid confusion.

The interface control unit 22, in its initial state, turns off the switch 7, turns on the switch 20, and prohibits any signal transfer from the device connector 6. Receiving a determination signal from the connection state detecting unit 8 indicating that the PC card 2 has been properly connected to the information processing device 21, the interface control unit 22 turns on the switch 7, turns off the switch 20, and removes the prohibition of the signal transfer from the device connector 6. On the other hand, when the interface control unit 22 receives a determination signal from the connection state detecting unit 8, indicating that the PC card 2 has been incorrectly connected to the information processing device 21, it turns off the switch 7, turns on the switch 20, and prohibits any signal transfer from the device connector 6. In other words, the interface control unit 22 remains in the initial state.

Figure 4:
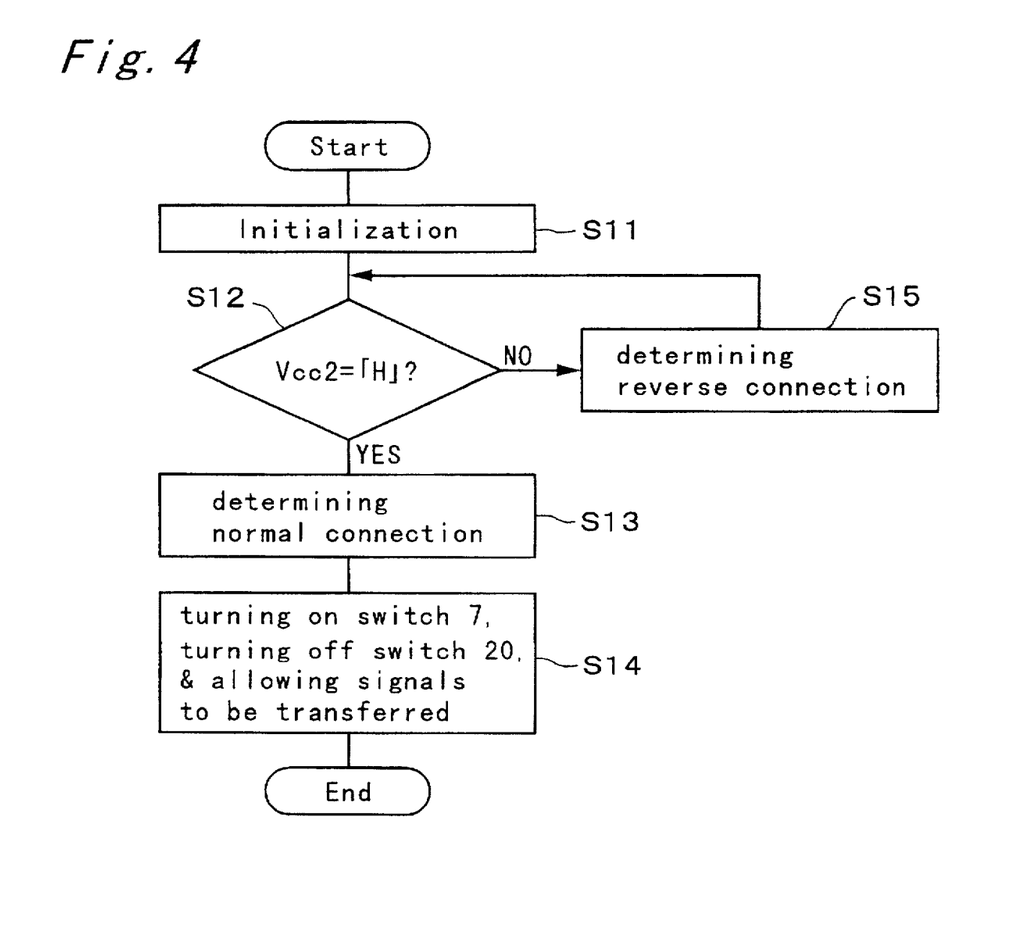
FIG. 4 is a flow chart showing the operation of the PC card system device shown in FIG. 3.

FIG. 4 is a flow chart showing an operation of the PC card system device 25 shown in FIG. 3.

In the step S11 the interface control unit 22 sets the initial state in which it turns off the switch 7, turns on the switch 20, and prohibits any signal transfer from the device connector 6. In the step S12 the connection state detecting unit 8 determines whether the level of its input terminal or the level of the Vcc2 contact of the device connector 6 is "H" or not. That is, the connection state detecting unit 8 determines whether the card connector 5 is properly connected to the device connector 6 or not. If the level is "H" (Yes), the operation moves to the step S13.

In the step S13 the connection state detecting unit 8 determines that the card connector 5 is properly connected to the device connector 6 and advances to step S14 after sending a signal indicating this determination to the interface control unit 22. In the step 14, after receiving the signal indicating that the PC card 2 is properly connected to the information processing device, the interface control unit 22 allows signals to be transferred from the output contacts of the device connector 6, turns on the switch 7, and turns off the switch 20. Then the operation ends. If the level of the signal is "L" (No) in the step S12, the operation moves to the step S15, where the connection state detecting unit 8 determines that the card connector 5 is incorrectly connected to the device connector 6 and the operation moves back to the step S12 after sending a signal indicating this determination to the interface control unit 22.

Thus, the PC card system device 25 of Embodiment 2 is able to determine whether or not the PC card 2 is incorrectly connected to the information processing device 21. The PC card system device 25 also prohibits any signal transfer from the device connector 6 unless the PC card 2 is properly connected to the information processing device 21. Further, when the PC card 2 is properly connected, a current does not flow through the resistor 9. Therefore, this embodiment prevents, in a simple and inexpensive way, electrical damage to the PC card 2 due to the incorrect connection and reduces the current consumption of the information processing device 21 when the PC card 2 is properly inserted.

Embodiment 3

In Embodiments 1 and 2 the power supply voltage Vcc is always applied to the Vcc1 contact of the device connector 6 even when the PC card 2 is not connected to the information processing device. Embodiment 3 of the present invention, however, does not allow the power supply voltage Vcc to be applied to the Vcc1 contact of the device connector 6, when the PC card 2 is not connected to the information processing device.

Figure 5:
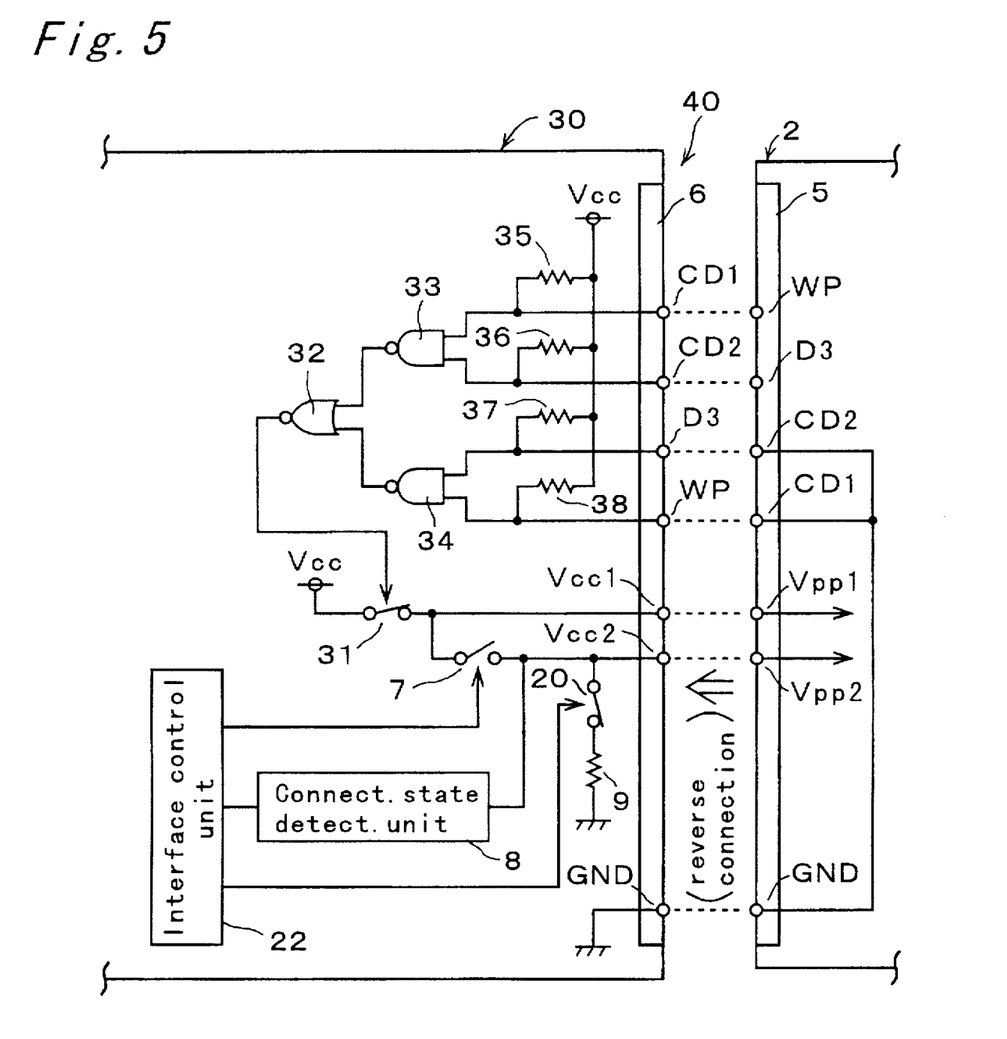
FIG. 5 is a schematic block diagram of the PC card system device of Embodiment 3 of the present invention.

FIG. 5 is the schematic block diagram of a PC card system device of Embodiment 3 of the present invention. The drawing shows the PC card 2 incorrectly connected to an information processing device. The like reference numerals in FIGS. 1, 3, and 5 indicate identical or functionally similar elements. Thus explanations of those elements will not be repeated and only the differences with FIG. 3 will be described below. Again, all other contacts of the connectors 5 and 6 which are unnecessary to description of the operation of this embodiment are not shown in FIG. 5 in order to avoid confusion.

A PC card system device 40 shown in FIG. 5 differs from the PC card system device 25 shown in FIG. 3 in that the PC card system device 40 comprises an information processing device 30 that includes, in addition to the information processing device 21 shown in FIG. 3, a switch 31 controlled by control signals, a two-input NOR circuit 32, two-input NAND circuits 33 and 34, and four pull-up resistors 35, 36, 37, and 38.

Referring to FIG. 5, the second contact of the card connector 5 and the second contact of the device connector 6 are referred to as D3; the thirty-third contact of the card connector 5 and the thirty-third contact of the device connector 6, WP; the thirty-sixth contact of the card connector 5 and the thirty-sixth contact of the device connector 6, CD1; and the sixty-seventh contact of the card connector 5 and the sixty-seventh contact of the device connector 6, CD2. The contacts CD1 and CD2 of the card connector 5 are connected to the ground terminal inside the PC card 2, which, in turn, is connected to the ground of the information processing device 30 when the PC card 2 is connected to the information processing device 30. The switch 31 forms a third switch means. The NOR circuit 32 and the NAND circuits 33 and 34 form a connection detection means.

The switch 31 is connected, on one end, to the DC power supply voltage Vcc and, on the other end, to the Vcc1 of the device connector 6 as well as to one end of the switch 7. The other end of the switch 7 is connected to the input terminal of the connection state detecting unit 8, to one end of the switch 20, and to the Vcc2 of the device connector 6. The switch 31 is controlled by the output signals from the NOR circuit 32. One of the input terminals of the NOR circuit 32 is connected to the output terminal of the NAND circuit 33 while the other input terminal is connected to the output terminal of the NAND circuit 34.

One of the input terminals of the NAND circuit 33 is connected to the CD1 of the device connector 6 and to the DC power supply Vcc through a resistor 35, while the other input terminal is connected to the CD2 of the device connector 6 and to the DC power supply Vcc through a resistor 36. Similarly, one of the input terminals of the NAND circuit 34 is connected to the D3 of the device connector 6 and to the DC power supply Vcc through a resistor 37, while the other input terminal is connected to the WP of the device connector 6 and to the DC power supply Vcc through a resistor 38.

With this configuration, when the PC card 2 is not inserted into the information processing device 30, the levels of CD1, CD2, D3, and WP of the device connector 6 are "H" whereas the output terminals of the NAND circuits 33 and 34 are "L". Accordingly, the output of the NOR circuit 32 is "H" and turns off the switch 31. Therefore, the power supply voltage Vcc is not applied to the Vcc1 of the device connector 6.

When the PC card 2 is properly connected to the information processing device 30, that is, when the device connector 6 is properly connected to the card connector 5, CD1s, CD2s, D3s, and WPs of both the device and the card connectors 5 and 6 are connected respectively. Since CD1 and CD2 of the card connector 5 are grounded, the output of the NAND circuit 33 is "H" and hence the output of the NOR circuit 32 is "L" regardless of the output level of the NAND circuit 34, which turns on the switch 31.

On the other hand, when the PC card 2 is incorrectly connected to the information processing device 30, that is, when the card connector 5 is incorrectly connected to the device connector 6, CD1 of the device connector 6 is connected to WP of the card connector 5; CD2 of the device connector 6, to D3 of the card connector 5; D3 of the device connector 6, to CD2 of the card connector 5; and WP of the device connector 6, to CD1 of the card connector 5. Since CD1 and CD2 of the card connector 5 are grounded, the output level of the NAND circuit 34 is "H". Accordingly, the output level of the NOR circuit 32 is "L" regardless of the output level of the NAND circuit 33, which turns on the switch 31. In this case the operation of the connection state detecting unit 8 and the interface control unit 22 are the same as they are in the case of Embodiment 2 and an explanation for them will not be given.

Figure 6:
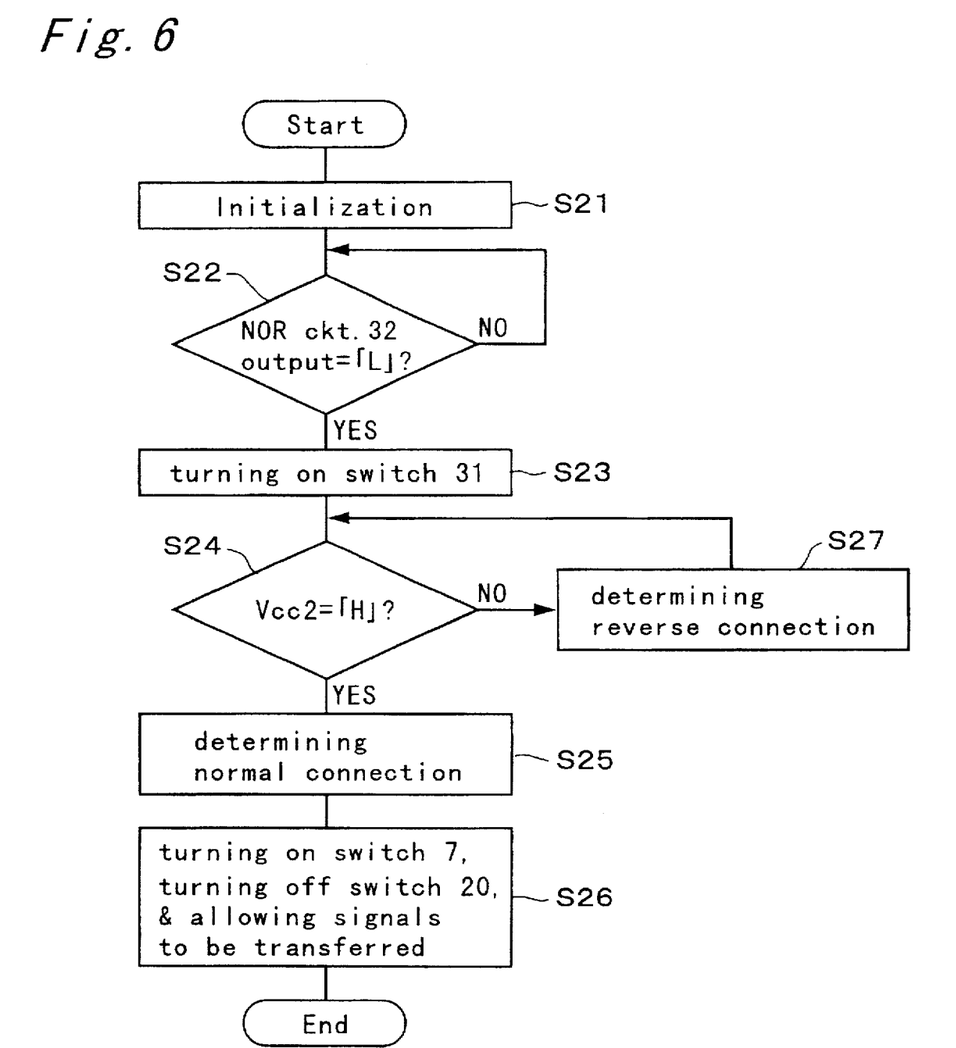
FIG. 6 is a flow chart showing the operation of the PC card system device shown in FIG. 5.

FIG. 6 is a flow chart showing the operation of the PC card system device 40 shown in FIG. 5.

In the step S21 the interface control unit 22 sets the initial state in which it turns off the switches 7 and 31, turns on the switch 20, and prohibits any signal transfer from the device connector 6. Next, in the step S22, the system determines whether or not the output level of the NOR circuit 32 is "L", that is, whether or not the PC card 2 is inserted in the card slot of the information processing device 30 or whether the card connector 5 is connected to the device connector 6. If the output level of the NOR circuit 32 is "L" (Yes), the operation advances to the step S23. If the output level of the NOR circuit 32 is "H" (No), however, the system goes back to the step S22.

In the step S23 the system turns on the switch 31 and advances to the step S24, where the connection state detecting unit 8 determines whether or not the level of its input terminal or the Vcc2 of the device connector 6 is "H", that is, whether or not the card connector 5 is properly connected to the device connector 6. If the level is "H" (Yes), then the operation advances to the step S25.

In the step S25 the connection state detecting unit 8 determines that the card connector 5 is properly connected to the device connector 6 and sends a signal indicating this determination to the interface control unit 22. Then the operation advances to the step S26, where, receiving the signal from the connection state detecting unit 8, the interface control unit 22 allows signals to be transmitted from the output contacts of the device connector 6, turns on the switch 7, and turns off the switch 20. This ends the operation. In the step S24, if the level of the input terminal of the connection state detecting unit 8 is "L" (No), the operation goes to the step S27, where the connection state detecting unit 8 determines that the PC card 2 is incorrectly connected and sends a signal indicating this determination to the interface control unit 22. Then the operation goes back to the step S24.

Thus, the PC card system device 40 of Embodiment 3 not only determines whether or not the PC card 2 is connected to the information processing device 30 but also determines whether or not the PC card 2 is properly connected to the information processing device 30. The PC card system device 40 prohibits any signal transfer from the device connector 6 unless the PC card 2 is properly connected to the information processing device 30. Further, it prevents any current from flowing through the resistor 9 when the PC card 2 is properly connected to the information processing device 30, and it prohibits the power supply voltage Vcc to be applied to the Vcc1 and Vcc2 of the device connector 6 if the PC card 2 is not properly connected.

Accordingly, this embodiment prevents, in a simple and inexpensive way, electrical damage to the PC card 2 due to the incorrect connection. It reduces the current consumption of the resistor 9 when the PC card 2 is properly inserted, thus decreasing the current consumption of the information processing device 30. Further it prevents noise from entering the power line of the information processing device 30 through the Vcc1 and Vcc2 of the device connector 6 when the PC card is not connected to the information processing device 30.

Embodiment 4

Figure 7:
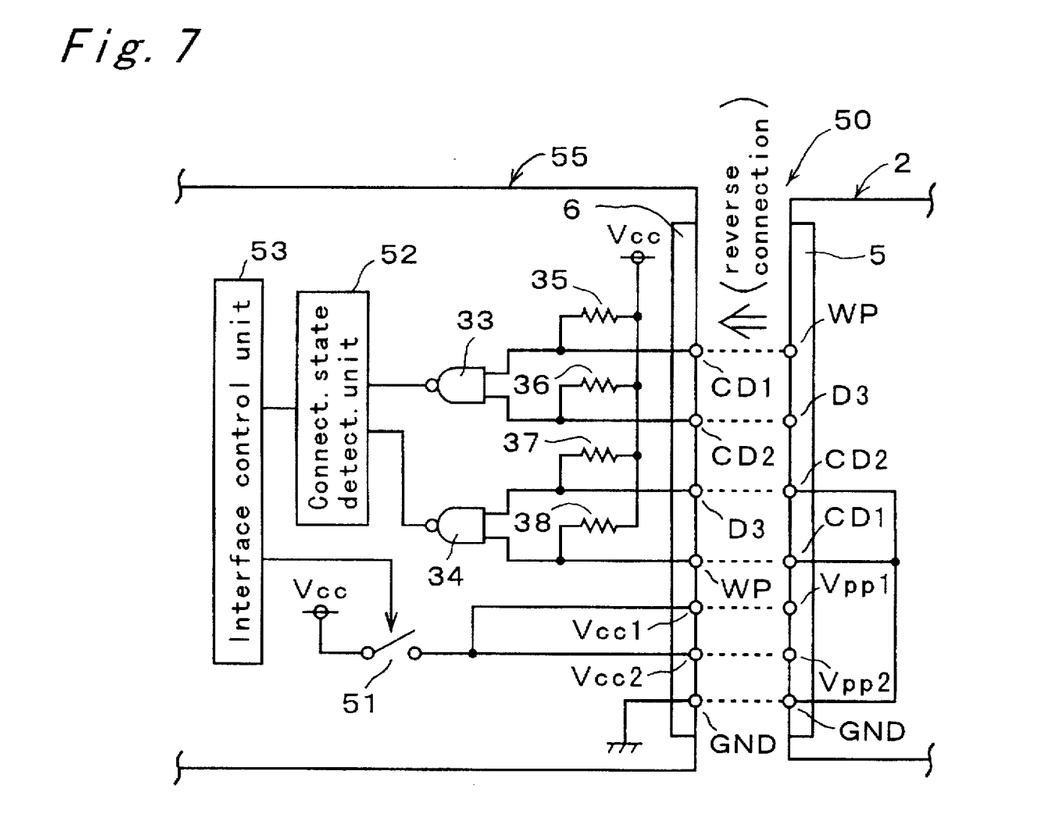
FIG. 7 is a schematic block diagram of the PC card system device of Embodiment 4 of the present invention.

FIG. 7 is a schematic block diagram of a PC card system device of Embodiment 4 of the present invention. The drawing shows the PC card 2 incorrectly connected to an information processing device. The like reference numerals in FIGS. 7 and 5 indicate identical or functionally similar elements. Thus explanation of those elements will not be repeated and only the differences with FIG. 5 will be described below. Again, all other contacts of the connectors 5 and 6 unnecessary to describe the operation of this embodiment are not shown in FIG. 7 in order to avoid confusion.

The PC card system device of this embodiment shown in FIG. 7 is obtained from that shown in FIG. 5 by removing the switches 7, 20, and 31, the connection state detecting unit 8, the resistor 9, and the NOR circuit 32, and by adding a switch 51 controlled by control signals and another connection state detecting unit 52 for detecting the connection state of the PC card 2. Corresponding to this difference, the interface control unit in FIG. 7 is referred to as an interface control unit 53; the information processing device in FIG. 7, as an information processing device 55; and the PC card system device in FIG. 7, as a PC card system device 50.

Referring to FIG. 7, the switch 51 is connected, on one end, to the DC power supply voltage Vcc and, on the other end, to the Vcc1 and Vcc2 of the device connector 6. The output terminals of the NAND circuits 33 and 34 are connected to the connection state detecting unit 52, which, in turn, is connected to the interface control unit 53. The connection state detecting unit 52 determines, according to signals produced at the NAND circuits 33 and 34, whether or not the PC card 2 is connected to the information processing device 55 and also whether or not the PC card 2 is properly connected to the information processing device 55, and then sends a signal indicating this determination to the interface control unit 53.

The interface control unit 53 controls the switch 51 depending upon the determination of the connection state detecting unit 52 and also controls he signal transfer from the device connector 6. The switch 51 forms a fourth switch means; the NAND circuits 33 and 34 end the connection state detecting unit 52, a connection state detecting means; and the interface control unit 53, an interface control means.

With this configuration, the initial state, representing the state in which the PC card 2 is not connected to the information processing device 55, sets CD1, CD2, D3, and WP of the device connector 6 to an "H" level and the output terminals of the NAND circuits 33 and 34 to an "L" level. The levels of these terminals make the connection state detecting unit 52 determine that the PC card 2 is not connected to the information processing device 55. Then the connection state detecting unit 52 sends a signal indicating this determination to the interface control unit 53, which, in turn, turns off the switch 51 and prohibits any signal transfer from the device connector 6.

If the PC card 2 is properly connected to the information processing device 55, the CD1s, CD2s, D3s, and WPs of both the device and the card connectors 5 and 6 are connected respectively. Since CD1 and CD2 of the card connector 5 are grounded, the output of the NAND circuit 33 is "H" and that of the NAND circuit 34 is "L". The connection state detecting unit 52 determines that the PC card 2 is properly connected to the information processing device 55 and sends a signal indicating this determination to the interface control unit 53, which, in turn, turns on the switch 51 and permits the signal transfer.

On the other hand, when the PC card 2 is incorrectly connected to the information processing device 55, CD1 of the device connector 6 is connected to WP of the card connector 5; CD2 of the device connector 6, to D3 of the card connector 5; D3 of the device connector 6, to CD2 of the card connector 5; and WP of the device connector 6, to CD1 of the card connector 5. Since CD1 and CD2 of the card connector 5 are grounded, the output levels of the NAND circuits 33 and 34 are "L" and "H" respectively. The connection state detecting unit 52 determines that the PC card 2 is incorrectly connected to the information processing device 55 and sends a signal indicating this determination to the interface control unit 53, which, in turn, turns off the switch 51 and prohibits any signal transfer from the device connector 6.

If the connection state detecting unit 52 finds the output levels of both the NAND circuits 33 and 34 to be "H", it determines that an abnormal event is taking place and sends a signal indicating this determination to the interface control unit 53, which, in turn, responds in the same way as in the case where the PC card 2 is incorrectly connected to the information processing device 55.

Figure 8:
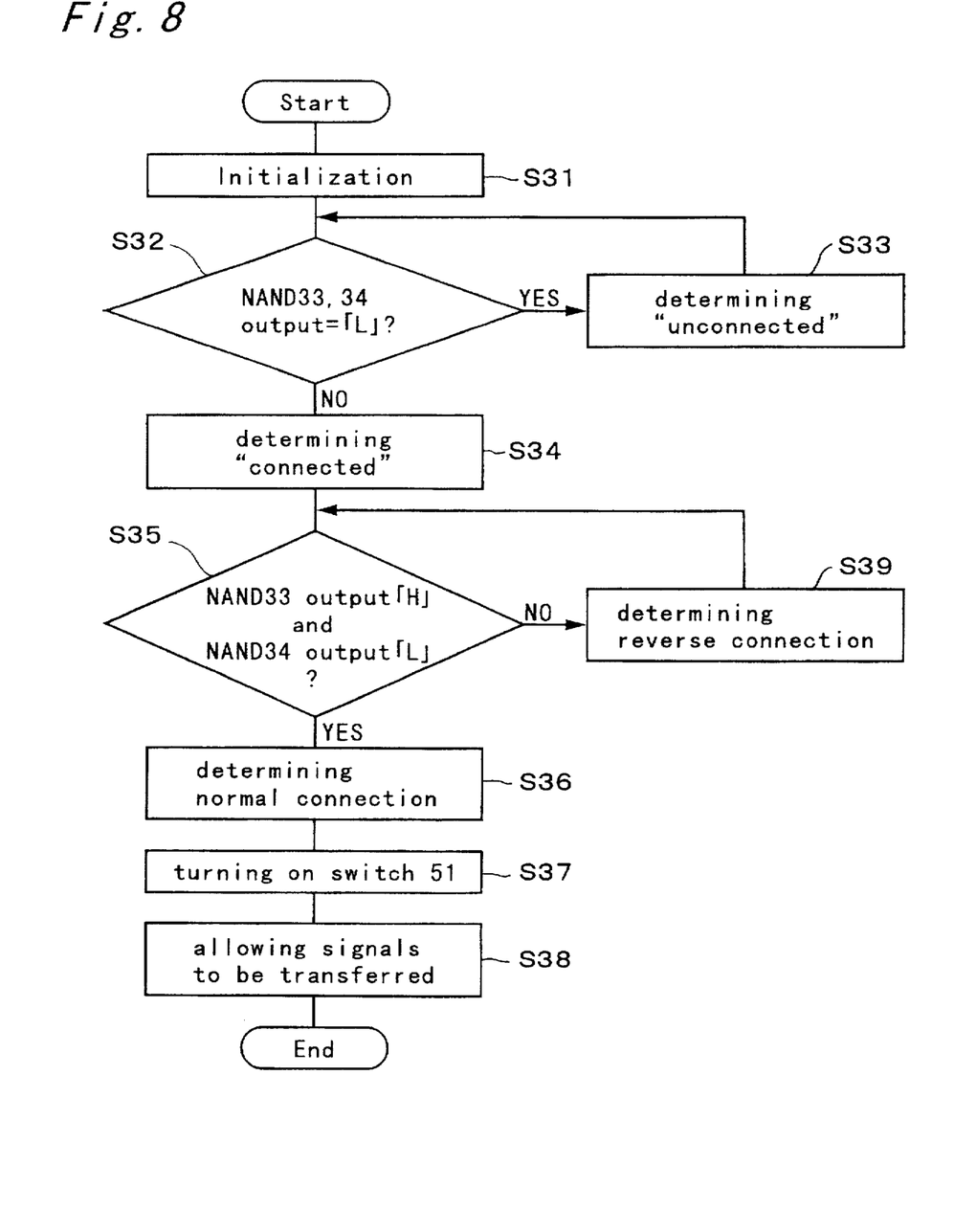
FIG. 8 is a flow chart showing the operation of the PC card system device shown in FIG. 7.

FIG. 8 is a flow chart showing the operation of the PC card system device 50 shown in FIG. 7.

In the step S31 the interface control unit 53 sets the initial state in which it turns off the switch 51 and prohibits any signal transfer from the device connector 6. Next, in the step S32, the connection state detecting unit 52 determines whether or not the output levels of both the NAND circuits 33 and 34 are "L", that is, whether or not the PC card 2 is connected to the information processing device 55. If the output levels of both the NAND circuits 33 and 34 are "L" (Yes), the operation advances to the step S33, where the connection state detecting unit 52 determines that the PC card 2 is not connected to the information processing device 55. Then the operation goes back to the step S32.

In the step S32, if the output levels of both the NAND circuits 33 and 34 are not "L" (No), the operation moves to the step S34, where the connection state detecting unit 52 determines that the PC card 2 is connected to the information processing device 55, and then the operation advances to the step S35. In this step the connection state detecting unit 52 determines whether or not the output level of the NAND circuit 33 is "H" and that of the NAND circuit 34 is "L", that is, whether or not the PC card 2 is properly connected to the information processing device 55. If the output level of the NAND circuit 33 is "H" and that of the NAND circuit 34 is "L" (Yes), the operation advances to the step S36, where the connection state detecting unit 52 determines that the PC card 2 is properly connected to the information processing device 55 and sends a signal indicating this determination to the interface control unit 53. Then the operation moves to the step S37.

In the step S37 the interface control unit 53 turns on the switch 51 and then, in the step S38, allows signals to be transferred from the device connector 6. Then the operation ends. In the step S35, if the output level of the NAND circuit 33 is "L" and that of the NAND circuit 34 is "H", or if the output levels of both the NAND circuits 33 and 34 are "H" (No), the operation moves to the step S39, where the connection state detecting unit 52 determines that the PC card 2 is not properly connected to the information processing device 55 and sends a signal indicating this determination to the interface control unit 53. Then the operation moves back to the step S35.

Thus, the PC card system device 50 of Embodiment 4 not only determines whether or not the PC card 2 is connected to the information processing device 55 but also determines whether or not the PC card 2 is properly connected to the information processing device 55. Unless the PC card 2 is properly connected to the information processing device 55, the PC card system device 50 prohibits any signal transfer from the device connector 6 and it also prevents the power supply voltage Vcc from being applied to the Vcc1 and Vcc2 of the device connector 6. Accordingly, this embodiment prevents, in a simple and inexpensive way, electrical damage to the PC card 2 due to the incorrect connection. Further, it prevents noise from entering the power line of the information processing device 55 through the Vcc1 and Vcc2 of the device connector 6 when the PC card is not inserted into the information processing device 55.

It should be noted that any elements and any functions of the PC card system devices of Embodiment 1 through 4 may be combined. For example, if the PC card system device 25 of Embodiment 2 and the PC card system device 50 of Embodiment 4 are combined, the interface control unit will be connected to both the connection state detecting units 8 and 52. If either the connection state detecting unit 8 or 52 determines that the PC card is incorrectly connected, the interface control unit turns off the switches 7 and 51, turns on the switch 20, and prohibits any signal transfer from the device connector 6.

As described above, in the PC card system device of the present invention, when the connection state detecting means determines, according to the signal level of at least one terminal of the device connection means, that the PC card is incorrectly connected to the information processing device, the interface control means prohibits any signal transfer from the device connection means. More specifically, either the seventeenth contact or fifty-first contact of the above device connection means, referred to as the Vcc1 terminal, may be connected to the power supply of the information processing device and the other contact, referred to as the Vcc2, may be connected to the power supply of the information processing device through a first switch means and to a pull-down resistor. In this case, the connection state detecting means determines that the PC card is incorrectly connected when the Vcc2 contact of the device connector means is "L", and that the PC card is properly connected when the Vcc2 contact of the device connector means is "H". Also, the interface control means turns on the first switch means only when the connection state detecting means determines that the PC card is properly connected.

Thus, the PC card system device is able to determine whether or not the PC card is incorrectly connected to the information processing device. The PC card system device also prohibits any signal transfer from the device connector means unless the PC card is properly connected to the information processing device, thus preventing, in a simple and inexpensive way, electrical damage to the PC card due to the incorrect connection.

The above PC card system device may further comprise a second switch means connected between the Vcc2 contact of the device connector means and the pull-down resistor. The interface control means turns off the second switch means only when the connection state detecting means determines that the PC card is properly connected. That is, when the PC card is properly connected, a current does not flow through the pull-down resistor. Therefore, this PC card system device prevents, in a simple and inexpensive way, electrical damage to the PC card due to the incorrect connection and reduces the current consumption of the information processing device when the PC card is properly inserted.

The above PC card system device may further comprise a connection detecting means and a third switch means. The connection detecting means determines whether or not the PC card is connected to the information processing device according to the signal level of at least one contact of the device connector means. The connection detecting means turns on the third switch means only when the connection detecting means determines that the PC card is connected to the information processing device, allowing the power voltage to be applied to the contacts of the device connector means, more specifically, to the contact Vcc1 and the first switch means. For example, the connection detecting means determines whether or not the PC card is connected to the information processing device according to the signal levels of the second, thirty-third, thirty-sixth, and sixty-seventh contacts of the device connector means. Further, in a case where the second, thirty-third, thirty-sixth, and sixty-seventh contacts of the device connector means are connected to pull-up resistors, the connection detecting means determines that the PC card is not connected to the information processing device when the second, thirty-third, thirty-sixth, and sixty-seventh contacts are all at an "H" level and that the PC card is connected to the information processing device when both the second and the thirty-third contacts are at an "L" level or when both the thirty-sixth and the sixty-seventh contacts are at an "L" level.

Thus, the above PC card system device determines whether or not the PC card is connected to the information processing device. The PC card system device also prevents the power supply voltage from being applied to the Vcc1 and Vcc2 of the device connector means if the PC card is not connected to the information processing device. Therefore, it prevents noise from entering the power line of the information processing device through the Vcc1 and Vcc2 of the device connector means when the PC card is not connected to the information processing device.

The PC card system device may comprise a fourth switch means, instead of the third switch means. In this case the interface control means turns on the fourth switch means allowing the power voltage to be applied to the terminals of the device connector means, more specifically, to the terminal Vcc1 and the first switch means, only when the connection state detecting means determines that the PC card is properly connected to the information processing device. For example, the above connection state detecting means determines whether or not the PC card is connected to the information processing device according to the signal levels of the second, thirty-third, thirty-sixth, and sixty-seventh contacts of the device connector means. In a case where the second, thirty-third, thirty-sixth, and sixty-seventh contacts of the device connector means are connected to pull-up resistors, the connection state detecting means determines that the PC card is not connected to the information processing device when the second, thirty-third, thirty-sixth, and sixty-seventh contacts are all at an "H" level. The connection state detecting means also determines that the PC card is properly connected to the information processing device when both the thirty-sixth and the sixty-seventh contacts are at an "L" level and that the PC card is incorrectly connected to the information processing device when both the second and the thirty-third terminals are at an "L" level.

Thus, the above PC card system device not only determines whether or not the PC card is connected to the information processing device but also determines whether or not it is properly connected. Unless the PC card is properly connected to the information processing device, the PC card system device prohibits any signal transfer from the device connector means, and it also prevents the power supply voltage from being applied to the Vcc1 and Vcc2 of the device connector means. Accordingly, this PC card system device prevents, in a simple and inexpensive way, electrical damage to the PC card due to the incorrect connection. Further it prevents noise from entering the power line of the information processing device through the Vcc1 and Vcc2 of the device connector means when the PC card is not inserted into the information processing device.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A PC card system device comprising a PC card in conformity with the PCMCIA/JEIDA PC card standard and an information processing device to which said PC card is to be connected, further comprising:

a card connector means, provided in said PC card, for connecting said PC card to said information processing device;

a device connector means, provided in said information processing device, in conformity with said PC card standard, for connecting said card connector means of said PC card;

a connection state detecting means for detecting the connection state of said PC card according to the signal level of at least one contact of said device connector means; and an interface control means for controlling the signal transfer from said device connector means according to the determination of said connection state detecting means, said interface control means prohibiting any signal transfer from said device connector means if said connection state detecting means determines that said PC card is incorrectly connected to said information processing device.

2. The PC card system device of claim 1 wherein either the seventeenth contact or fifty-first contact of said device connector means, referred to as the Vcc1 contact, is connected to the power supply of said information processing device and the other contact, referred to as the Vcc2, is connected to the power supply of said information processing device through a first switch means and to a pull-down resistor, and wherein said interface control means turns on said first switch means only when said connection state detecting means determines that said PC card is properly connected.

3. The PC card system device of claim 2 wherein said connection state detecting means determines that said PC card is incorrectly connected when the Vcc2 contact of said device connector means is "L", and that said PC card is properly connected when the Vcc2 contact of said device connector means is "H".

4. The PC card system device of claim 2 further comprising a second switch means connected between said Vcc2 contact of said device connector means and said pull-down resistor, said interface control means turning off said second switch means only when said connection state detecting means determines that said PC card is properly connected.

5. The PC card system devise of claim 4 further comprising:
- a connection detecting means for determining whether or not said PC card is connected to said information processing device according to the signal level of at least one contact of said device connector means; and
- a third switch means for controlling the supply of power from said information processing device to the contact Vcc1 of the device connector means and to said first switch means,
- said connection detecting means turning on said third switch means to allow the power supply voltage to be applied to said contact Vcc1 and to said first switch means only when said connection detecting means determines that said PC card is connected to said information processing device.

6. The PC card system device of claim 5 wherein said connection detecting means determines whether or not said PC card is connected to said information processing device according to the signal levels of the second, thirty-third, thirty-sixth, and sixty-seventh terminals of said device connector means.

7. The PC card system device of claim 6 wherein the second, thirty-third, thirty-sixth, and sixty-seventh contacts of said device connector means are connected to pull-up resistors and wherein said connection detecting means determines that said PC card is not connected to said information processing device when said second, thirty-third, thirty-sixth, and sixty-seventh contacts are all at an "H" level and that said PC card is connected to said information processing device when both said second and said thirty-third contacts are at an "L" level or when both said thirty-sixth and said sixty-seventh contacts are at an "L" level.

8. The PC card system device of claim 5 further comprising a fourth switch means, placed between the power supply of said information processing device and the terminals of said device connection means for providing power to said PC card, for controlling the supply of power to said PC card,
- said interface control means turning on said fourth switch means allowing the power voltage to be applied to said contacts of said device connector means only when said connection state detecting means determines that said PC card is properly connected to said information processing device.

9. The PC card system device of claim 8 wherein said connection state detecting means determines whether or not said PC card is connected to said information processing device according to the signal levels of the second, thirty-third, thirty-sixth, and sixty-seventh contacts of said device connector means.

10. The PC card system device of claim 9 wherein the second, thirty-third, thirty-sixth, and sixty-seventh contacts of said device connector means are connected to pull-up resistors and wherein said connection state detecting means determines that said PC card is not connected to said information processing device when said second, thirty-third, thirty-sixth, and sixty-seventh contacts are all at an "H" level.

11. The PC card system device of claim 10 wherein said connection state detecting means determines that said PC card is properly connected to said information processing device when both said thirty-sixth and said sixty-seventh contacts are at an "L" level.

12. The PC card system device of claim 10 wherein said connection state detecting means determines that said PC card is incorrectly connected to said information processing device when both said second and said thirty-third contacts are at an "L" level.

13. The PC card system device of claim 4 further comprising a fourth switch means which controls the supply of power from said information processing device to said first switch means and to the contact Vcc1 of said device connector means,
- said interface control means turning on said fourth switch means and allowing the power voltage to be applied to said first switch means and to the contact Vcc1 of said device connector means only when said connection state detecting means determines that said PC card is properly connected to said information processing device.

14. The PC card system device of claim 1 further comprising:
- a connection detecting means for determining whether or not said PC card is connected to said information processing device according to the signal level of at least one terminal of said device connector means; and
- a third switch means, placed between the power supply of said information processing device and the terminals of said device connector means for providing power to said PC card, for controlling the supply of power to said PC card,
- said connection detecting means turning on said third switch means only when said connection detecting means determines that said PC card is connected to said information processing device, allowing the power voltage to be applied to said terminals of said device connector means.

* * * * *